United States Patent
Chen

(10) Patent No.: US 6,818,878 B2
(45) Date of Patent: Nov. 16, 2004

(54) MULTI-RESOLUTION CHARGE-COUPLED DEVICE SENSING DEVICE

(75) Inventor: Yen-Cheng Chen, Hsinchu (TW)

(73) Assignee: Avision Inc., Hsinchu (TW)

( * ) Notice: Subject to any disclaimer, the term of this patent is extended or adjusted under 35 U.S.C. 154(b) by 0 days.

(21) Appl. No.: 10/639,594

(22) Filed: Aug. 13, 2003

(65) Prior Publication Data

US 2004/0036089 A1 Feb. 26, 2004

(30) Foreign Application Priority Data

Aug. 22, 2002 (TW) .................................. 91118946 A

(51) Int. Cl.[7] .............................................. H01L 27/00
(52) U.S. Cl. ....................... 250/208.1; 348/294; 377/63
(58) Field of Search ....................... 250/208.1, 214 SW, 250/214 R; 348/294, 298, 307, 311, 316; 377/63, 64, 60, 57

(56) References Cited

U.S. PATENT DOCUMENTS

| | | | | |
|---|---|---|---|---|
| 4,918,506 A | * | 4/1990 | Dyck | .......................... 257/234 |
| 5,262,871 A | * | 11/1993 | Wilder et al. | ................ 348/307 |
| 5,874,993 A | * | 2/1999 | Ciccarelli et al. | ............ 348/294 |
| 6,639,202 B2 | * | 10/2003 | Chen | ........................ 250/208.1 |

* cited by examiner

*Primary Examiner*—David Porta
*Assistant Examiner*—Seung C. Sohn
(74) *Attorney, Agent, or Firm*—Rabin & Berdo, P.C.

(57) ABSTRACT

A multi-resolution charge-coupled device (CCD) sensing device is provided. The multi-resolution CCD sensing device achieves the object of the invention by using more than two CCD shift registers. The purpose of the invention is to combine and store the charge signals from a longer CCD shift register to a shorter CCD shift register, and then to shift out the charge signals, so as to attain transmission functions with different resolutions. It can achieve the economy of smaller size and lower cost by using the multi-resolution CCD sensing device according to the invention, thereby increasing scanning speeds at lower resolutions.

3 Claims, 11 Drawing Sheets ated sensing device (CCD) sensing device, and more particularly to a multi-resolution CCD sensing device applied to the CCD module and the Contact Image Sensor (CIS) module.

MULTI-RESOLUTION CHARGE-COUPLED DEVICE SENSING DEVICE

This application claims the benefit of Taiwan application Serial No. 91118946, filed Aug. 22, 2002.

BACKGROUND OF THE INVENTION

1. Field of the Invention

The invention relates in general to a multi-resolution charge-coupled device (CCD) sensing device, and more particularly to a multi-resolution CCD sensing device applied to the CCD module and the Contact Image Sensor (CIS) module.

2. Description of the Related Art

Scanners have become widely used in recent years. The user is required to choose from scanning modes with different resolutions when scanning, in accordance with the properties of the document to be scanned. There are several conventional ways to set the resolution, which might be accomplished by using either software or hardware. Using hardware is usually faster and more direct.

The scanning procedures for the scanner with the CCD module are stated as follows. The carriage in the scanner has a light source, and after the light source produces light, it is reflected by the document being scanned, and the light is directed back to the carriage. The light signal is processed by optical components, such as mirrors and lenses, and is then received by the CCD module. The CCD module senses the magnitude of the light signal and then generates corresponding scanned image data.

Referring to FIG. 1, a CCD module using a conventional CCD sensing apparatus is shown. The CCD module includes a CCD sensing device 102, a control circuit 104, and an output capacitor C. The CCD sensing device 102 includes a photo sensor set 106, a shift gate 108, and a CCD shift register 110. The CCD sensing device 102, with a resolution of 1200 dpi (dot per inch), is used here as an example. If a CCD sensing device 102 is used to sense a document of 8 inches in width, then the photo sensor set 106 includes 1200×8=9600 photo sensing components. FIG. 1 shows eight photo sensing components, D1~D8, that convert light signals into charge signals. The photo sensing components may be photo diodes. The shift gate 108 is used for controlling the transmission of the charge signals. When the photo-sensing components are exposed to light for a predetermined period of time, the photo sensing components generate a corresponding amount of charge, and then the shift gate 108 is turned on to transfer the charge signals to the CCD shift register 110. The CCD shift register 110 may be a two-phase CCD shift register 110. The CCD shift register 110, with 1200 dpi for sensing a document of 8 inches in width, includes 19200 CCD components. FIG. 1 shows 16 CCD components, E1~E8 and E1'~E8', that correspond to the photo-sensing components D1~D8. The CCD components E1~E8 and E1'~E8' are arranged alternately, and are also controlled by phase signals F1 and F2, respectively. Subsequently, by the control of phase signals F1 and F2, the charge signals stored in the CCD components are sequentially output. As shown in FIG. 1, eight photo-sensing components D1~D8 out of the 9600 photo sensing components generate charge signals S1~S8. The charge signals S1~S8 can be transferred to CCD components E1~E8. The control circuit 104 is used to store the charge signals, which are output from the CCD shift register 110, in the capacitor C sequentially to acquire the analog output signal Out. The output signal Out is processed by a next stage circuit (not shown), and the scanned image data are then obtained.

However, users need to be able to use different scanning modes with different resolutions. For example, a high-resolution scanning mode is required if the document to be scanned is a color image. If the document to be scanned is text, it simply requires a low-resolution scanning mode. In FIG. 1, due to the CCD sensing device 102 is a high-resolution sensing device, some properties of the CCD sensing device 102 have to be discarded during low-resolution scanning. Besides, scanning time may be wasted during low-resolution scanning.

FIG. 1 shows the CCD sensing device 102 configured for high resolution and being used for low-resolution 600 dpi scanning; the operation is described as follows: after the photo-sensing components D1~D8 are exposed to light, the charge signals S1~S8 are stored in the CCD components E1~E8. When the charge signals S1~S8 are output, a simpler method is to require the control circuit 104 to store 4800 sequential charge signals, such as S2, S4, S6, and S8, etc., in capacitor C in order to obtain the 600 dpi scanned image data. Another improved method is to require the control circuit 104 to store 9600 sequential charge signals grouping every two charge signals together, such as S1+S2, S3+S4, S5+S6, and S7+S8, etc., in capacitor C to obtain the corresponding analog voltage values, such as charge signals S1+S2, S3+S4, S5+S6, and S7+S8, etc., so as to obtain 600 dpi scanned image data. Although the scanned image data are of low resolution, the time it takes to shift out the electric charges stored in the CCD components to the capacitor C is still the same as before and does not decrease. Therefore, for the conventional CCD sensing device 102, scanning at a low resolution take the same amount of time as scanning at a high resolution.

The chips for CCD sensing at different resolutions have been widely used in the marketplace. To solve the above-mentioned problem, CCD modules with multiple CCD sensing devices of several different resolutions have also become available on the market.

Referring to FIG. 2, a conventional CCD module with multiple CCD sensing devices is shown. The CCD module with three CCD sensing devices is used as an example for further illustration. The CCD module has a CCD sensing device 202a with a resolution of 1200 dpi, a CCD sensing device 202b with a resolution of 600 dpi, and a CCD sensing device 202c with a resolution of 300 dpi. Similarly, using CCD sensing devices for an 8-inch wide document as an example, the CCD sensor sets 206a, 206b, and 206c of the CCD sensing devices 202a, 202b, and 202c have 9600, 4800, and 2400 photo-sensing components, respectively. Here, the eight photo sensing components Da1~Da8, Db1~Db8, and Dc1~Dc8 are used in the example. The CCD sensing devices 202a, 202b, and 202c, respectively, include CCD shift registers 210a, 210b, and 210c; and the CCD shift registers 210a, 210b, and 210c include 2400, 1200 and 600 CCD components, respectively. The CCD shift register 210a is controlled by phase signals F1a and F2a, while the CCD shift register 210b is controlled by phase signals F1b and F2b, and the CCD shift register 210c is controlled by phase signals F1c and F2c. When shift gates 208a, 208b, and 208c are turned on, the charge signals stored in the CCD components Da1~Da8, Db1~Db8, and Dc1~Dc8 can be shifted to the CCD shift registers 210a, 201b, and 210c, respectively.

When the user chooses different scanning modes with different scanning resolutions, the control circuit 204 will choose the outputs of the corresponding CCD sensing devices 202a, 202b, and 202c and send them to capacitor C. Thus, the photo sensor sets 206a, 206b, and 206c are simultaneously exposed to light and store the charge signals in the CCD shift registers 210a, 210b, and 210c while scanning. When choosing the scanning mode of 1200 dpi, the control circuit 204 chooses the output of CCD shift register 210a; or, when choosing the scanning mode of 600 dpi or 300 dpi, the control circuit 204 chooses the output of CCD shift registers 210b and 210c. Since the CCD components of the CCD shift registers 210b and 210c are both far fewer than that of CCD shift register 210a, the time it takes to shift out the stored charges to capacitor C is far less in CCD shift registers 210b or 210c than in CCD shift register 210a. Therefore, using the CCD module in FIG. 2 while scanning at a low resolution will enhance the scanning speed.

Furthermore, using the CCD module 200 in FIG. 2 will confront the following disadvantageous situations. The conventional CCD module uses a chip consisting of three juxtaposed CCD sensing devices with different resolutions. Failure to focus precisely might be caused during exposure to light. The photo sensor sets 206a, 206b, and 206c are parallel with one another and simultaneously receive the light signals from the same optical components. If the optical components are set to focus on the photo sensor set 206a, scanning at a low resolution might result in failure to focus precisely and the scanning quality might be seriously reduced. This makes it necessary to use three different CCD sensing devices belonging to three different chips, thus the required size is very large and the cost is markedly higher.

SUMMARY OF THE INVENTION

It is therefore an object of the invention to provide a multi-resolution charge-coupled device (CCD) sensing device, used for scanning at different resolutions. The multi-resolution CCD sensing device along with a photo sensor set and several CCD shift gates and several CCD shift registers achieve economy of size, lower costs, and a higher yield rate. It speeds the scanning at a low resolution, and also greatly reduces the failure to focus, therefore enhancing image scanning quality.

The invention achieves one of the above-identified objects by providing a multi-resolution charge-coupled device (CCD) sensing device, including a first CCD shift register, a second shift gate, and a second CCD shift register. The first CCD shift register has 2M first CCD components, which are Ea[1], Ea[1]', Ea[2], Ea[2]', ..., Ea[M], and Ea[M]', respectively. Ea[1], Ea[2], ..., Ea[M] temporarily store M charge signals S[1], S[2], ..., S[M], respectively. The second shift gate is coupled to the first CCD shift register. The second CCD shift register is coupled to the second shift gate and has 2N second CCD components, which are Eb[1], Eb[1]', Eb[2], Eb[2]', ..., Eb[N], Eb[N]', respectively. The charge signals stored in the first CCD shift register can be transferred to the second CCD shift register while the second shift gate is turned on. M is equal to L times N, where L is an integer greater than 1, and the charge signals are directly shifted out from the first CCD shift register while transmitting at a first resolution. While transmitting at a second resolution, which is 1/k times the first resolution (where k is a factor of L, L/k=j, k>1), firstly, a variable i is set to 0, i is an integer, and the charge signals stored in the first CCD components Ea[(k*i)+1] to Ea[(k*i)+k] are combined, the charge signals stored in the first CCD components Ea[(k*i+L)+1] to Ea[(k*i+L)+k] are combined, ..., and the charge signals stored in the first CCD components Ea[(k*i+L*(N−1))+1] to Ea[(k*i+L*(N−1))+k] are combined, and the N set of combined charge signals are stored in the corresponding second CCD components Eb[1], Eb[2], ..., and Eb[N] respectively. Then, the charge signals, which have been combined in the second CCD components Eb[1], Eb[2], ..., Eb[N], are shifted out from the second CCD shift register, so as to achieve the first combining and shifting out procedure. Secondly, the value of i is charged from 1 to (j−1) in order, wherein each time the value of i is incremented by 1, the combining and shifting out procedure as mentioned above repeat once each time, until all of the charge signals stored in the first CCD shift register are output.

Other objectives, features, and advantages of the invention will become apparent from the following detailed description of the preferred but non-limiting embodiments. The following description is made with reference to the accompanying drawings.

DETAILED DESCRIPTION OF THE INVENTION

The multi-resolution charge-coupled device (CCD) sensing device, according to the invention, along with two or more CCD shift registers achieves the object of a transmission function with multiple-resolutions. The above-mentioned CCD shift registers are formed on the same chip, so as to achieve economy of size, lower costs, and a higher yield rate.

Embodiment 1

Figure 3:
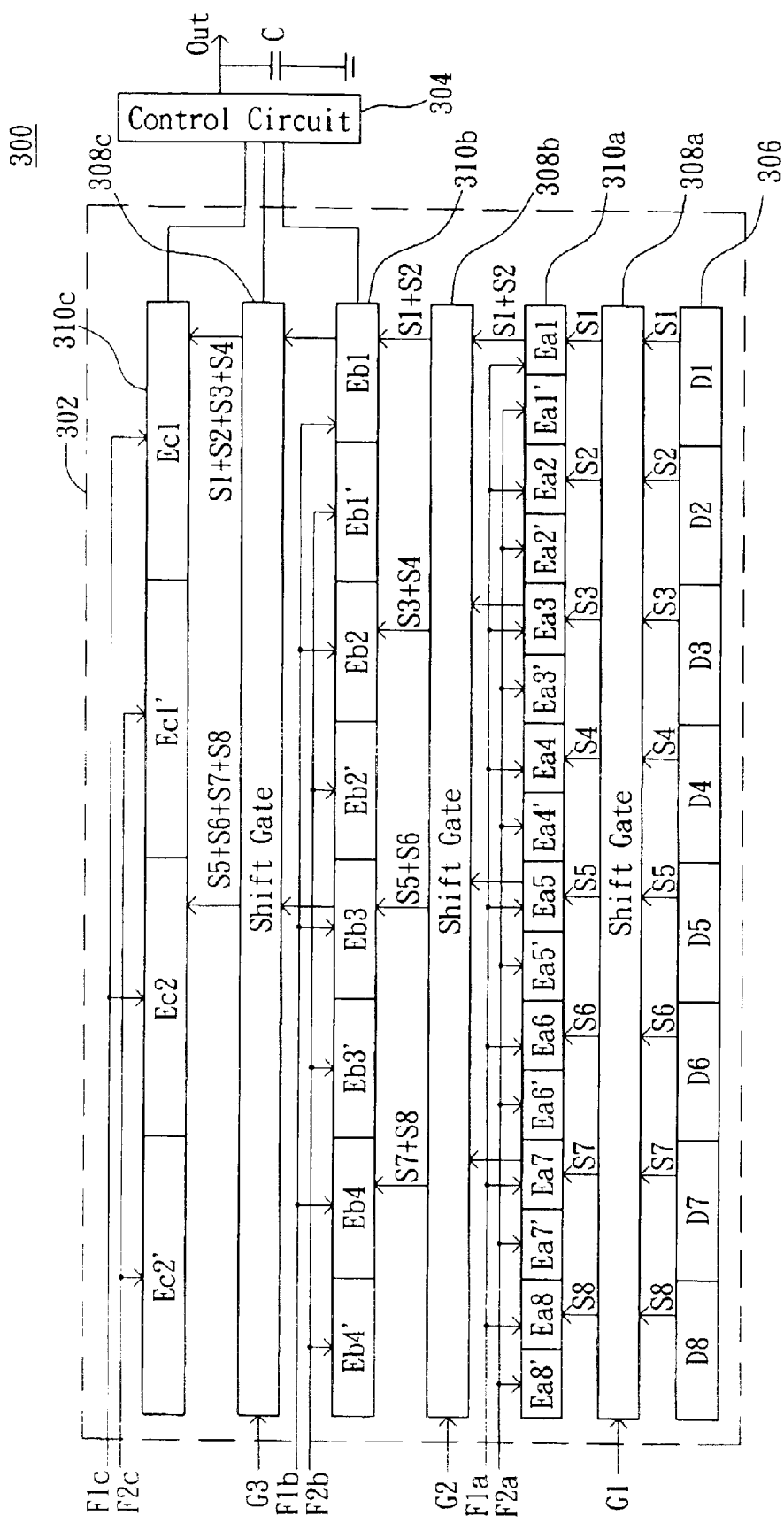
FIG. 3 is a block diagram of a CCD module using a multi-resolution CCD sensing device according to a first embodiment of the invention.

FIG. 3 shows a block diagram of a CCD module using a multi-resolution CCD sensing device according to a first embodiment of the invention. The CCD module 300 using the multi-resolution CCD sensing device 302 further includes a control circuit 304 and an output capacitor C. The CCD sensing device 302 includes a photo sensor set 306, a first shift gate 308a, a first CCD shift register 310a, a second shift gate 308b, a second CCD shift register 310b, a third shift gate 308c, and a third CCD shift register 310c. For example, the CCD module 300 has: the first CCD shift register 310a with a resolution of 1200 dpi (dots per inch), the second CCD shift register 310b with a resolution of 600 dpi, and the third CCD shift register 310c with a resolution of 300 dpi.

The photo sensor set 306 includes 9600 photo sensing components, which can be used for scanning an 8-inch wide document at a resolution of 1200 dpi. To illustrate this simply, the figure shows only the photo sensing components D1~D8, which can receive light signals and generate multiple corresponding charge signals S1~S8, accordingly. The first shift gate 308a is coupled to the photo sensor set 306. The CCD components Ea1, Ea2, Ea3, Ea4, Ea5, Ea6, Ea7, and Ea8 of the first CCD shift register 310a are coupled to the first shift gate 308a. The CCD components Ea1', Ea2', Ea3', Ea4', Ea5', Ea6', Ea7', and Ea8' of the first CCD shift register 310a are not coupled to the first shift gate 308a, which simply follows the prior art of the conventional two-phase CCD shift register. The second shift gate 308b is coupled to the CCD components Ea1, Ea3, Ea5, and Ea7 of the first CCD shift register 310a. The second shift gate 308b is not coupled to Ea2, Ea4, Ea6, and Ea8 of the first CCD shift register 310a, which is one of the features of the embodiment that will be illustrated with a detailed reason later. Furthermore, the second CCD shift register 310b is coupled to the second shift gate 308b. The third shift gate 308c is coupled to the CCD components Eb1 and Eb3 of the second CCD shift register 310b, but is not coupled to Eb2 and Eb4. The third CCD shift register 310c is coupled to the third shift gate 308c.

The first CCD shift register 310a, the second CCD shift register 310b, and the third shift register 310c for resolutions of 1200 dpi, 600 dpi, and 300 dpi, respectively, for example, are all two-phase CCD shift registers, which include 19200, 9600, and 4800 CCD components, respectively. To illustrate this simply, the figure only includes one section as an example, such as the photo sensing components D1~D8 that correspond to the first CCD components Ea1~Ea8 and Ea1'~Ea8', the second CCD components Eb1~Eb4 and Eb1'~Eb4', and the third CCD components Ec1~Ec2 and Ec1'~Ec2'. The first CCD components Ea1~Ea8 and Ea1'~Ea8' are arranged alternately and are controlled by phase signals F1a and F2a, respectively. The second CCD components Eb1~Eb4 and Eb1'~Eb4' are arranged alternately and are controlled by phase signals F1b and F2b, respectively. The third CCD components Ec1~Ec2 and Ec1'~Ec2' are also arranged alternatively and are controlled by phase signals F1c and F2c, respectively.

When the first shift gate 308a is turned on, the charge signals S1~S8 can be transfer from the photo sensing components D1~D8 of the photo sensor set 306 to the first CCD components Ea1~Ea8 of the first CCD shift register 310a (the method of transferring is described in FIG. 5 later). When the second shift gate 308b is turned on, the charge signals S1~S8 stored in the first CCD components Ea1~Ea8 of the first shift register 310a can be transferred to the second CCD components Eb1~Eb4 of the second CCD shift register 310b. When the third shift gate 308c is turned on, the charge signals S1~S8 stored in the second CCD components Eb1~Eb4 of the second shift register 310b can also be transferred to the third CCD components Ec1~Ec2 of the third CCD shift register 310c.

Moreover, two of the charge signals S stored in the first CCD components Ea can be combined and stored to one of the second CCD components Eb. For example, the charge signals S1 and S2, stored in the first CCD components Ea1 and Ea2, can be combined together in the second CCD component Eb1; the charge signals S3 and S4, stored in the first CCD components Ea3 and Ea4, can be combined together in the second CCD component Eb2; and so on. In addition, two of the charge signals S stored in the second CCD components Eb can be combined and stored in one of the third CCD components Ec. Charge signals S1+S2 and S3+S4, stored in the second CCD components Eb1 and Eb2, can be combined together in the third CCD component Ec1; and charge signals S5+S6 and S7+S8, stored in the second CCD components Eb3 and Eb4, can be combined together in the third CCD component Ec2.

The CCD sensing module 300 of the embodiment can scan with three different resolutions. While scanning at a resolution of 1200 dpi, the charge signals S, which are generated after the photo sensor set 306 senses light, are transferred from the photo sensor set 306 to the first CCD shift register 310a with a resolution of 1200 dpi, and are then shifted put from the first CCD shift register 310a. While scanning at a resolution of 600 dpi, the charge signals S, which are generated after the photo sensor set 306 senses light, are transferred from the photo sensor set 306 to the first CCD shift register 310a, and then from the first CCD shift register 310a to the second CCD shift register 310b with a resolution of 600 dpi, and then they are shifted out from the second CCD shift register 310b. In addition, while scanning at a resolution of 300 dpi, the charge signals S, which are generated after the photo sensor set 306 senses light, are transferred from the photo sensor set 306 to the first CCD shift register 310a, and then from the first CCD shift register 310a to the second CCD shift register 310b, and then from the second CCD shift register 310b to the third CCD shift register 310c with a resolution of 300 dpi, and then they are shifted out from the third CCD shift register 310c. The control circuit 304 selectively receives the charge signals from the CCD shift register 310a, 310b, or 310c according to the scanning resolution and stores them in the output capacitor C for the acquisition of the scanned image data.

Figure 4:
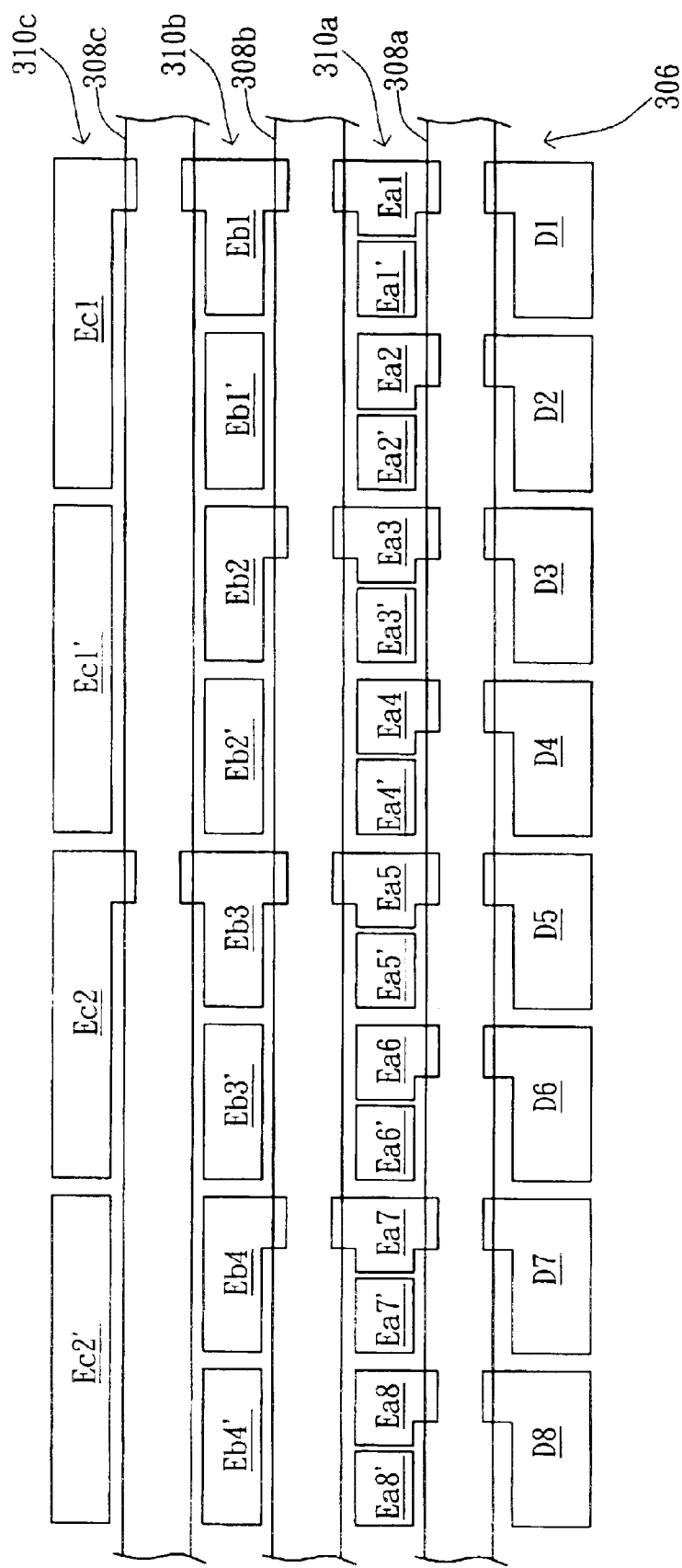
FIG. 4 shows a block diagram of the CCD sensing device in FIG. 3.

Referring to FIG. 4, a circuit layout diagram of the CCD sensing device of the FIG. 3 is shown. The shift gate 308a, 308b, and 308c can be manufactured using poly-silicon, which is conductive. In the layout, the first shift gate 308a partially overlaps the photo sensor set 306 and the first CCD shift register 310a, so that while the first shift gate 308a is turned on, the charge signals stored in the photo sensing components D can be transferred to the first CCD components Ea. Similarly, the second shift gate 308b partially overlaps the first CCD shift register 310a and the second CCD shift register 310b, and the third shift gate 308c partially overlaps the second CCD shift register 310b and the third CCD shift register 310c, so that the charge signals can be transferred while the second shift gate 308b and the third shift gate 308c are turned on.

Figure 5:
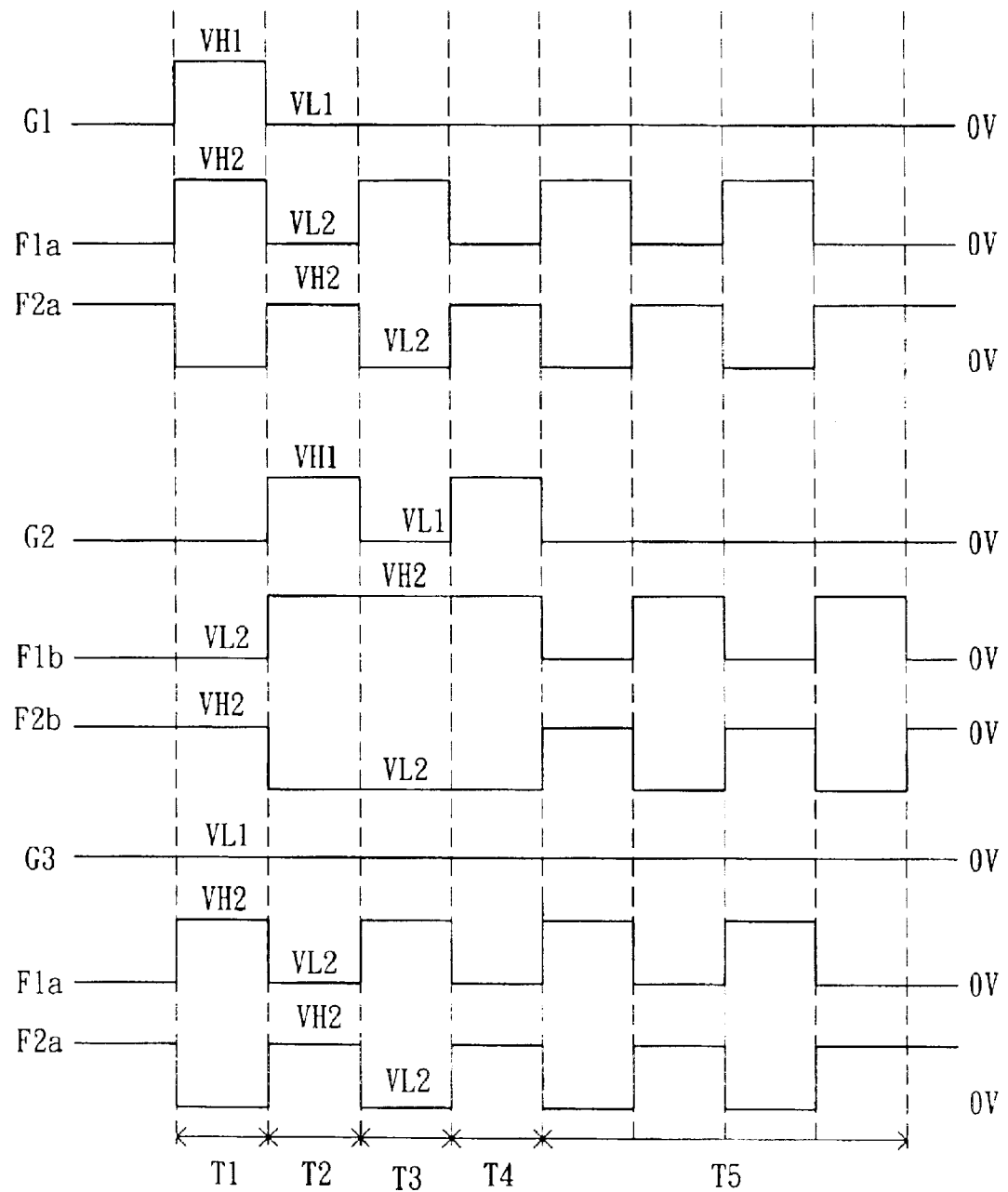
FIG. 5 illustrates a signal waveform for controlling the CCD sensing device in FIG. 3.

FIG. 5 shows a signal waveform for controlling the CCD sensing device, as shown in FIG. 3. In order to combine the charge signals, a suitable timing relation of the control signals G1, G2, and G3 of the first shift gate 308a, the second shift gate 308b, and the third shift gate 308c, respectively, and the phase signals F1a and F2a, F1b and F2b, and F1c and F2c are chosen. FIG. 5 shows an example of scanning at a resolution of 600 dpi. A detailed description of the process of combining charge signals is given in the following section.

First, the control signal G1 is changed to a first high voltage level VH1 to turn on the shift gate 308a, and the phase signal F1a also is changed to a second high voltage level VH2, so that the charge signals S can be transferred from the photo sensor set 306 to the first CCD shift register 310a during the time interval T1. For example, the charge signals S1 and S2 are transferred from the photo sensing components D1 and D2 to the first CCD components Ea1 and Ea2. Since the charge signals S are conventionally defined as being composed of negative charge, the second high voltage level VH2 must be a positive voltage to attract the charge signals S.

Subsequently, the control signal G1 is changed to a first low voltage level VL1 to turn off the shift gate 308a, and the control signal G2 is changed to the first high voltage level VH1 to turn on the shift gate 308b during the time interval T2. The phase signal F1a is changed to a second low voltage level VL2, and the phase signal F1b is changed to the second high voltage level VH2, so that part of the charge signals S can be transferred from the first CCD shift register 310a to the second CCD shift register 310b. In the embodiment, the charge signals S1, S3, S5, and S7 can be transferred from the first CCD components Ea1, Ea3, Ea5, and Ea7 to the second CCD components Eb1, Eb2, Eb3, and Eb4, respectively. However, the charge signals S2, S4, S6, and S8 stored in the first CCD components Ea2, Ea4, Ea6, and Ea8, respectively, are not transferred to the second CCD shift register 310b because the second shift gate 308b is not coupled to the first CCD components Ea2, Ea4, Ea6, and Ea8 of the first CCD shift register 310a. On the contrary, in the embodiment of the invention, the phase signal F2a is changed to the second high voltage level VH2, so as to make the charge signals S2, S4, S6, and S8 stored in Ea2, Ea4, Ea6, and Ea8 shift right to Ea1', Ea3', Ea5', and Ea7'.

The control signal G2 is then changed to the first low voltage level VL1 to turn off the shift gate 308b, and the phase signals F2a and F1a is converted to second low voltage level VL2 and the second high voltage level VH2, respectively, so as to make the charge signals S still stored in the first CCD shift register 310a shift right during the time interval T3. That is to say, the above-stated charge signals S2, S4, S6, and S8, which have been shifted to Ea1', Ea3', Ea5', and Ea7', can be further shifted to Ea1, Ea3, Ea5, and Ea7, respectively.

J Later, the control signal G2 is changed to the first high voltage level VH1 to make the shift gate 308b turned on in the time interval T4. The phase signal F1a is converted from its high voltage to the second low voltage level VL2, and phase signal F1b also is converted to the second high voltage level VH2, so that the remaining charge signals in the first CCD shift register 310a can be transferred to the second CCD shift register 310b. In other words, the charge signals S2, S4, S6, and S8, which have been shifted to the first CCD components Ea1, Ea3, Ea5, and Ea7, can be transferred to the second CCD components Eb1, Eb2, Eb3, and Eb4. At this time, the second CCD components Eb1, Eb2, Eb3, and Eb4 store the charge signals S1+S2, S3+S4, S5+S6, and S7+S8, respectively. That is, the charge signals S1 and S2 are combined in the second CCD component Eb1; the charge signals S3 and S4 are combined in the second CCD component Eb2; the charge signals S5 and S6 are combined in the second CCD component Eb3; and the charge signals S7 and S8 are combined in the second CCD component Eb4. Every two charge signals in the first CCD components Ea have been combined and stored in one of the second CCD components Eb during the time interval T4. Therefore, the charge signals stored in the second CCD shift register 310b can be shifted out to the output capacitor C to obtain the output signal Out, and the scanned image data of 600 dpi are then generated by having the control signal G2 changed to first low voltage level VL1, turning off the shift gate 308b and making the phase signals F2b and F1b alternately changed to the second high voltage level VH2 and the second low voltage level VL2 during the time interval T5.

Accordingly, since the CCD shift register 310c is not used in the processes described above, the voltage of control signal G3 can continuously maintain in the first low voltage level VL1 to prevent any charge signals from transferring to the CCD shift register 310c. As for the phase signals F1c and F2c corresponding to the CCD shift register 310c, because they do not involve in actual shifting of the charge signals and are also separated from the charge signals by the shift gate 308c, the voltage of the phase signals F1c and F2c can alternate between the second high voltage level VH2 and the second low voltage level VL2, which are the most commonly used CCD phase signals.

Furthermore, the operating principles of scanning at a resolution of 300 dpi are similar to that of scanning at a resolution of 600 dpi. Provided that every two charge signals stored in the second CCD shift register 310b can be combined together and stored in the third CCD shift register 310c, and then the charge signals are shifted out, the scanned image data of 300 dpi are thus obtained.

Therefore, while scanning at a low resolution of 600 dpi, only 9600 CCD components Eb are required for processing in order to shift out the charge signals stored in Eb in the CCD shift register 310b. The required time is less than that while scanning at a high resolution of 1200 dpi, due to the time spent shifting out the charge signals through 19200 CCD components Ea. Consequently, while scanning at a low resolution of 300 dpi, only 4800 CCD components Ec are required for processing in order to shift out the charge signals stored in Ec in the CCD shift register 310c. The required time is less than that used while scanning at a resolution of 600 dpi, due to the time spent shifting out the charge signals through 9600 CCD components Eb. Hence, it speeds up scanning by using the multi-resolution CCD sensing device according to the invention for scanning at a low resolution.

Moreover, the multi-resolution CCD sensing device, according to the invention, uses the same photo sensor set 306, no matter what the scanning resolution is for the same color channel of the three primary colors of RGB. Compared to the prior art shown in FIG. 2, a different location for the photo sensor set 206 is required for the same color channel when scanning at the different resolutions. Thus the optical components can keep focusing the light signal on the photo sensor set 306 without causing a failure to focus, thereby enhancing the image scanning quality.

Figure 1:
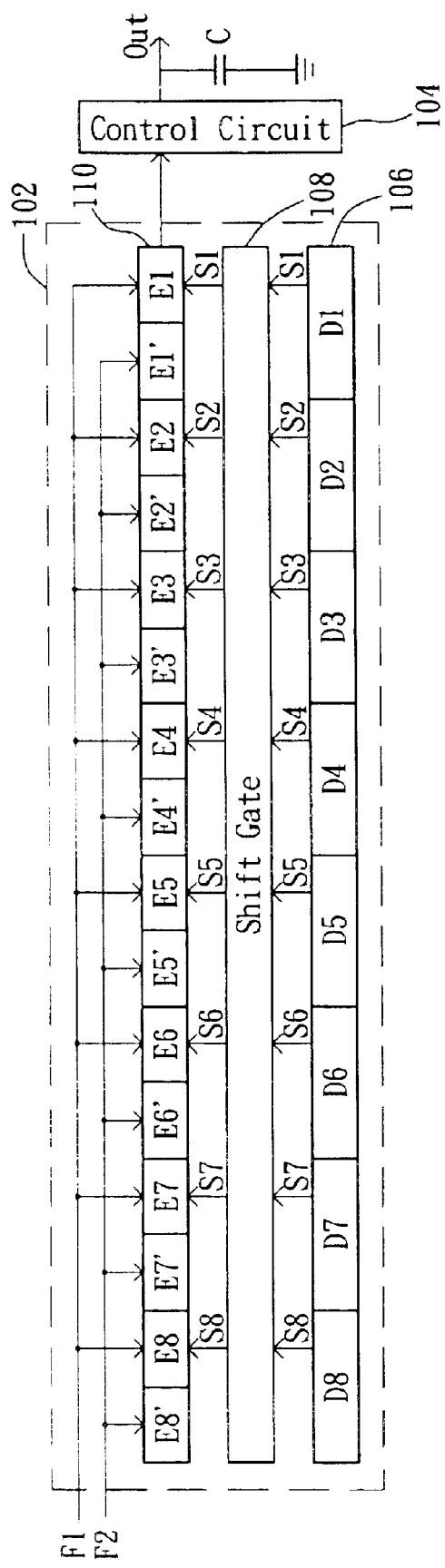
FIG. 1 (prior art) illustrates a CCD module using a conventional charge-coupled device (CCD) sensing device.
Figure 2:
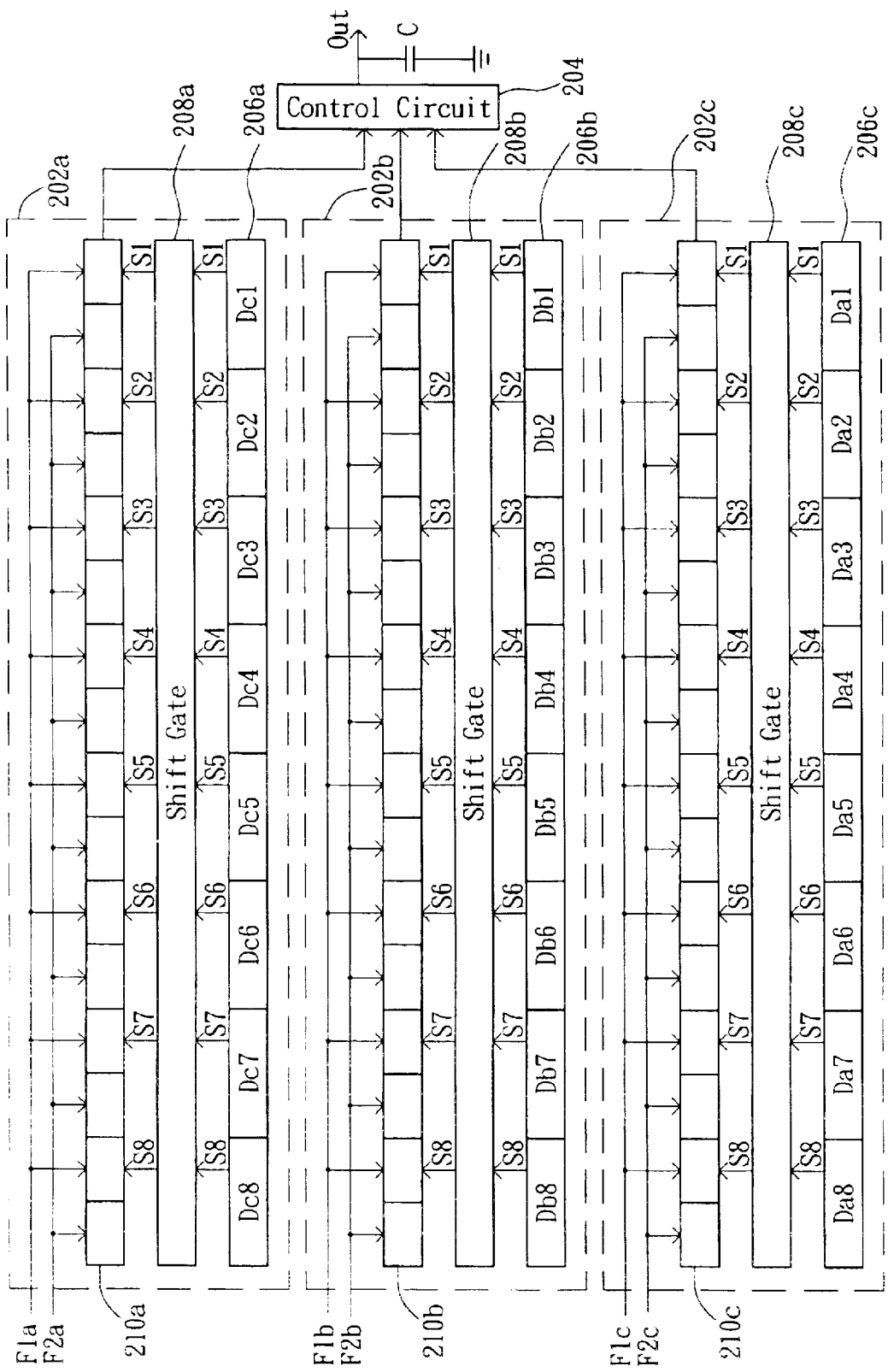
FIG. 2 (prior art) illustrates a conventional CCD module with multiple CCD sensing devices.

For the whole CCD sensing device, including the three primary colors of RGB, according to the invention, the required chip width of the invention, which is the distance from the photo sensor set 306 to the CCD shift register 310c in FIG. 3, is far narrower than that of the conventional CCD sensing device, which is the distance shown in FIG. 2 from the photo sensor set 206c to the CCD shift register 210a. Hence, the problem of focusing accuracy in different color channels is also greatly improved.

Furthermore, the multi-resolution CCD sensing device, according to the invention, using one photo sensor set requires fewer components than the conventional CCD sensing device shown in FIG. 2, and, therefore, achieves the economy of size required by chips and reduces costs. Also, due to the reduction of chip size, the yield rate is thus raised.

The multi-resolution CCD sensing device stated above is not only applied to the CCD module but also applied to the CIS (Contact Image Sensor) module. The main difference between the CIS module and the CCD module is that the CIS module directly contacts the underside of the glass where the document is placed to be scanned and receives the light signal reflected by the document. However, the CIS module still requires photo sensing components for sensing the light signal and CCD shift registers for storing the charge signals. The multi-resolution CCD sensing device, according to the invention, has photo-sensing components and CCD shift registers, and, therefore, can be applied to the CIS module.

Moreover, the invention is not limited to include only CCD shift registers with resolutions of 1200 dpi, 600 dpi, and 300 dpi, but may include CCD shift registers with other resolutions, according to actual requirements.

Embodiment 2

Figure 6:
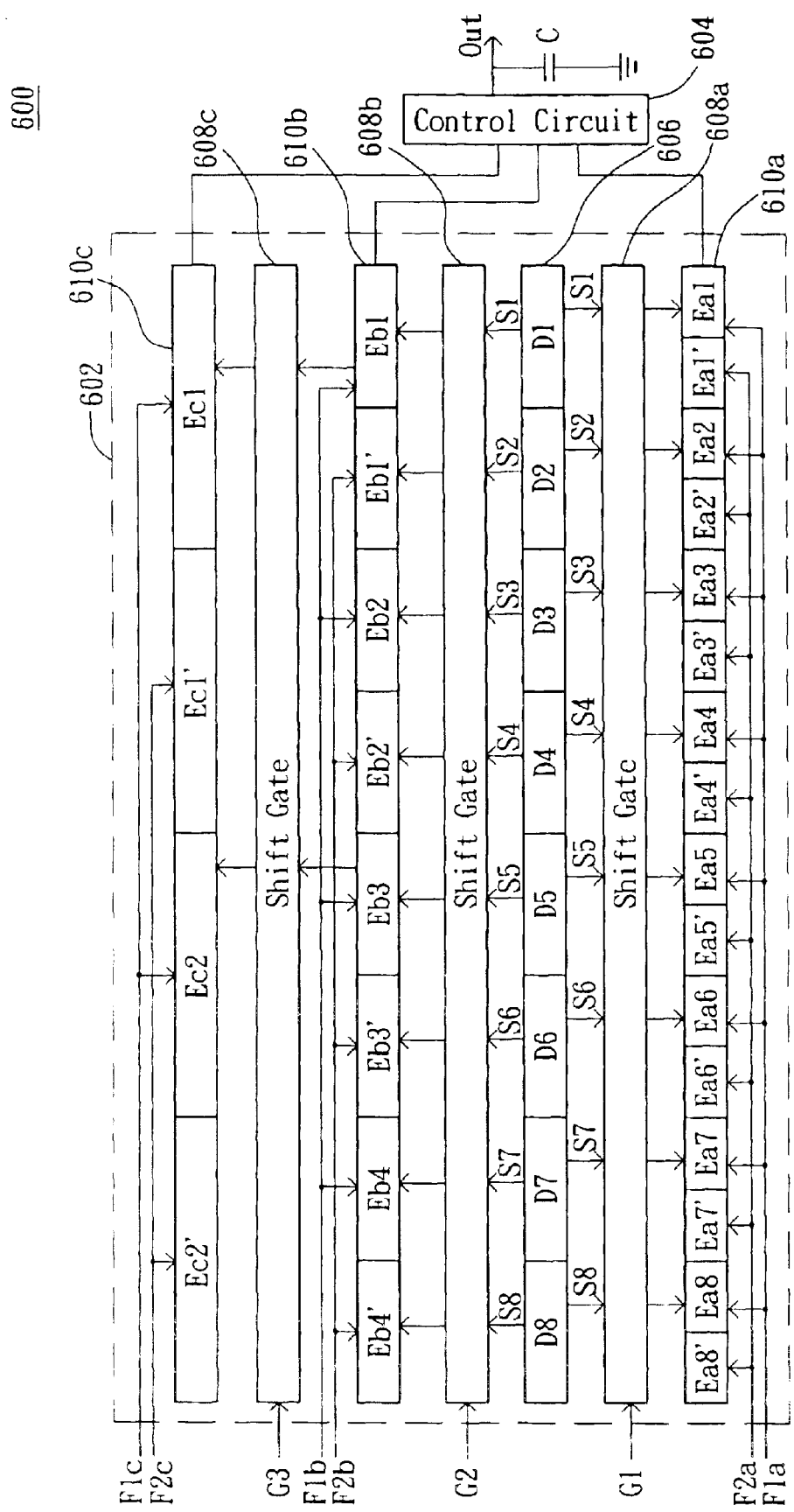
FIG. 6 is a block diagram of a CCD sensing device using a multi-resolution CCD sensing device according to a second embodiment of the invention.
Figure 7:
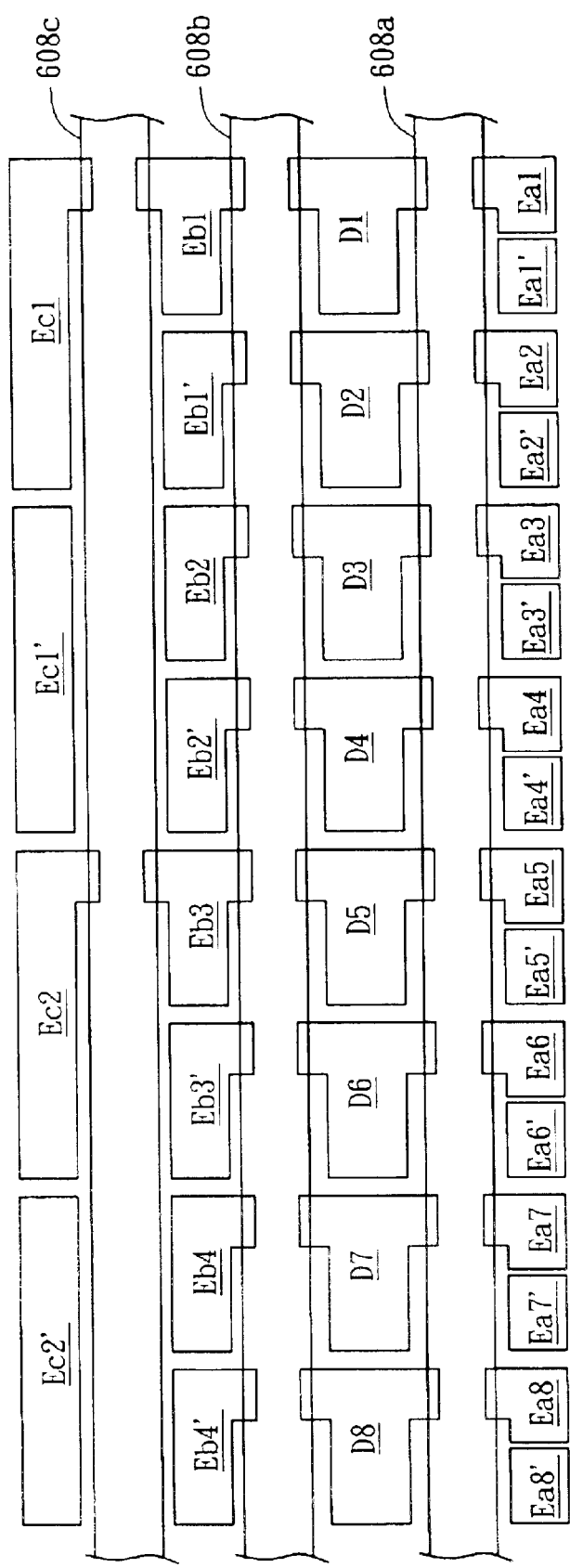
FIG. 7 shows a block diagram of the CCD sensing device in FIG. 6.

Referring to FIG. 6, a block diagram of a CCD sensing device using a multi-resolution CCD sensing device according to a second embodiment of the invention is shown. The main difference between the CCD sensing device 602 and the CCD sensing device 302 in FIG. 3 is that a first shift gate 608a and a second shift gate 608b are coupled to a photo sensor set 606, respectively. Charge signals generated by the photo sensor set 606 can be transferred to a first CCD shift register 610a through the first shift gate 608a, or can be transferred to a second CCD shift register 610b through the second shift gate 608b. Also, similarly, a third shift gate 608c is coupled to the second CCD shift register 610b, so as to have the charge signals stored in the second CCD shift register 610b be transferred to a third CCD shift register 610c. A circuit layout diagram of the CCD sensing device in FIG. 6 is shown in FIG. 7.

Figure 8:
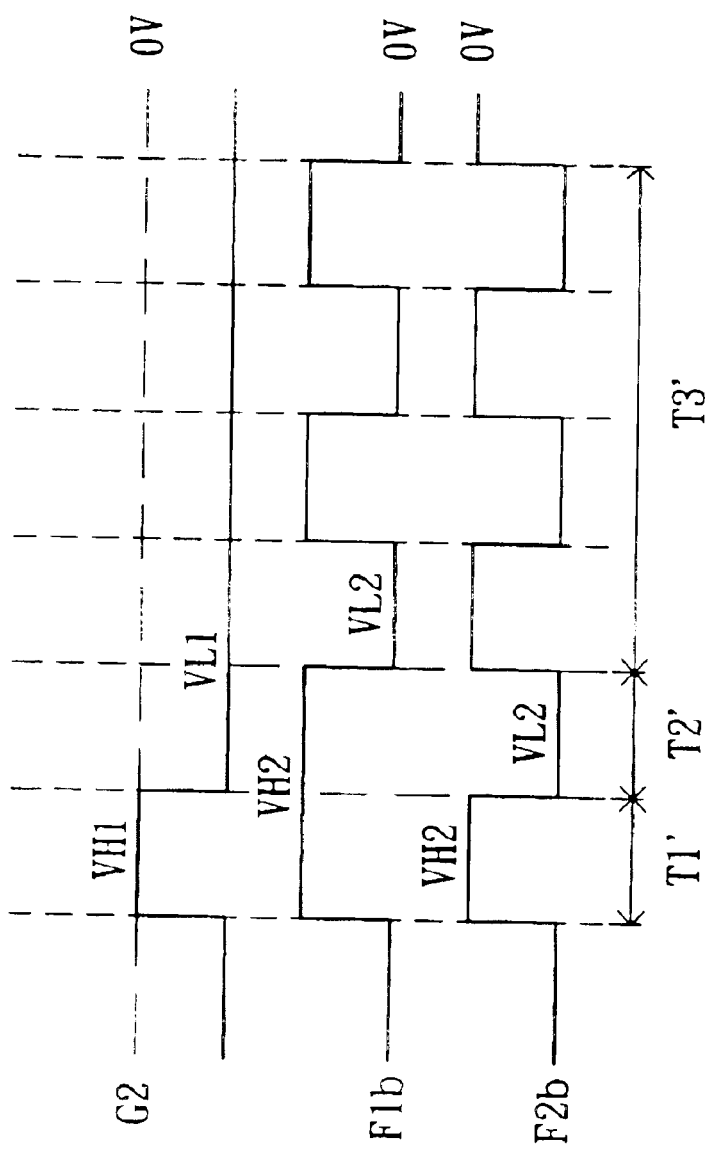
FIG. 8 illustrates a signal waveform for controlling the CCD sensing device in FIG. 6.

FIG. 8 illustrates the signal waveform for controlling the CCD sensing device in FIG. 6, taking 600 dpi scanning as an example. The main difference between the first embodiment and the second embodiment is that the charge signals generated by the photo sensor set 606 can be transferred directly to the second CCD shift register 610b with a resolution of 600 dpi in this embodiment, rather than as shown in the first embodiment, the charge signals have to be transferred to the first CCD shift register 310a and then transferred to the second CCD shift register 310b. Referring to FIG. 8, first the control signal G2 is changed to a first high voltage level VH1 to turn on the shift gate 608b. The phase signals F1b and F2b are also both converted to a second high voltage level VH2, so that all the charge signals S can be transferred from the photo sensor set 606 to the second CCD shift register 610b during the time interval T1'. For example, the charge signals S1 and S2 are transferred from the photo sensing components D1 and D2 to the second CCD components Eb1 and Eb1', respectively.

Subsequently, the control signal G2 is changed to a first low level voltage VL1 to turn off the shift gate 608b, and the voltage of the phase signal F1b maintains the second high voltage level VH2, while the phase signal F2b is changed to a second low voltage level VL2, so that the charge signals stored in the second CCD components Eb' can be shifted right to the second components Eb to be combined during the time interval T2'. For example, the charge signal S2 stored in the second CCD components Eb1' can be shifted right to the second components Eb1, and, in the meantime, the charge signal S1 originally stored in the second components Eb1 is combined with charge signal S2 in the second CCD component Eb1.

Later, since the charge signals of the second CCD components Eb and Eb' are combined in the second CCD components Eb, the charge signals S stored in the second CCD shift register 610b can be shifted out to the output capacitor C to obtain the output signal Out, and the scanned image data of 600 dpi are then generated by having the phase signals F2b and F1b alternately converted to the second high voltage level VH2 during the following time interval T3'.

Embodiment 3

Figure 9:
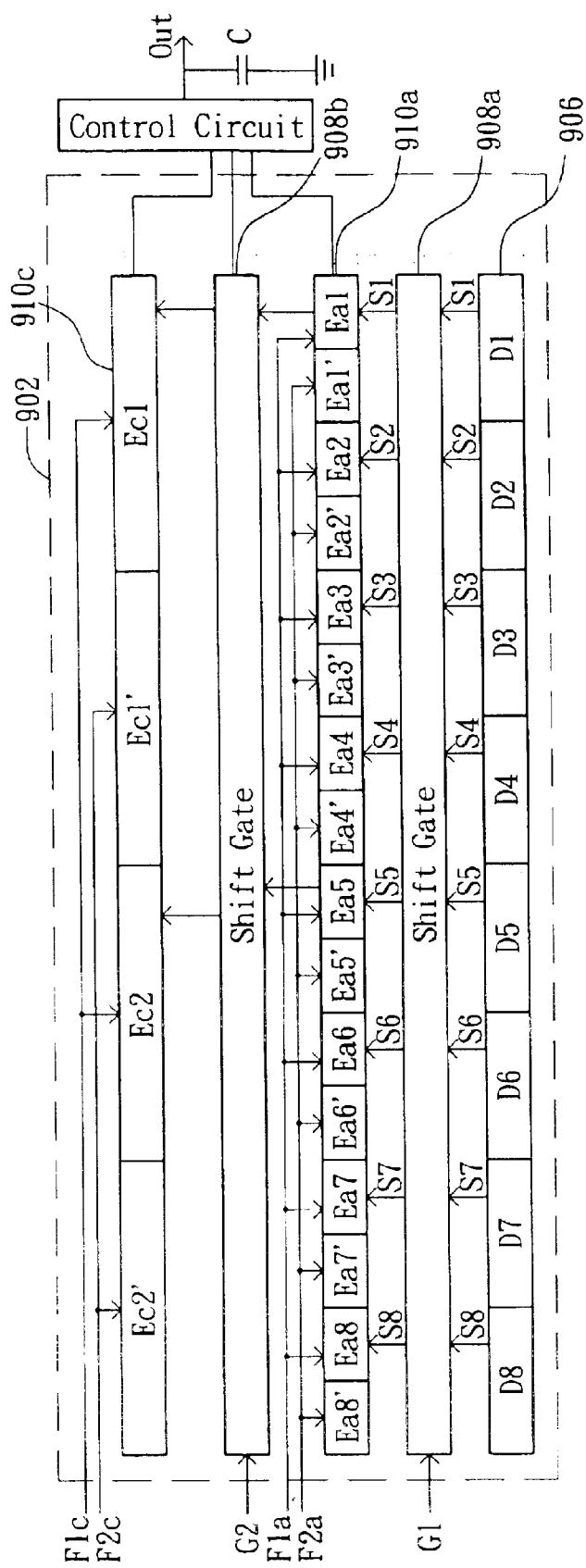
FIG. 9 is a block diagram of a CCD module using a multi-resolution CCD sensing device according to a third embodiment of the invention.

Referring to FIG. 9, a block diagram of a CCD module using a multi-resolution CCD sensing device according to a third embodiment of the invention is shown. The main difference between CCD sensing device 902 and CCD sensing device 302 in FIG. 3 is that it does not require the use of CCD shift register 310b or CCD shift gate 308c to achieve the object of scanning at resolutions of 1200 dpi, 600 dpi, and 300 dpi.

The CCD sensing device according to the third embodiment of the invention includes at least a photo sensor set 906, shift gates 908a and 908b, and CCD shift registers 910a and 910c for resolutions of 1200 dpi and 300 dpi, respectively.

The feature of the third embodiment, according to the invention, is that only CCD components Ea1, Ea5, Ea9, . . . , Ea (1+4P) are coupled to the shift gate 908b (where P is a positive integer) in the CCD shift register 910a for scanning at a resolution of 1200 dpi. FIG. 9 shows that CCD components Ea1 and Ea5 are coupled to the shift gate 908b.

Accordingly, while scanning at a resolution of 1200 dpi, charge signals S1 to S8 are shifted out from the CCD shift register 910a. While scanning at a resolution of 600 dpi, first, with respect to half of the charge signals stored in the CCD components, every two charge signals in the CCD components Ea are combined together and stored in one of the CCD components Ec, and then the charge signals are shifted out from the CCD shift register 910c for the first time for the acquisition of the first image data signals. For example, the charge signals S1 and S2 stored in the CCD components Ea1 and Ea2 are combined and stored in the CCD component Ec1, and the charge signals S5 and S6 stored in the CCD components Ea5 and Ea6 are combined and stored to the CCD component Ec2. Then, the charge signals S1+S2 and S5+S6, stored in the CCD components Ec1 and Ec2, are shifted out from the CCD shift register 910c to obtain the first image data signals. Subsequently, with respect to the other half of the charge signals stored in the CCD components Ea, every two charge signals are combined together and stored to one of the CCD components Ec, and then the charge signals are shifted out from the CCD shift register 910c for the second time to obtain the second data image signals. For example, the charge signals S3 and S4, stored in the CCD components Ea3 and Ea4, are combined and stored in the CCD component Ec1, and the charge signals S7 and S8, stored in the CCD components Ea7 and Ea8, are combined and stored in the CCD component Ec2. Then, the charge signals S3+S4 and S7+S8, stored in the CCD components Ec1 and Ec2, are shifted out to obtain the second data image signals.

Therefore, to obtain data image signals at a resolution of 600 dpi, all required is to combine the first data image signals with the second data image signals.

In addition, while scanning at a resolution of 300 dpi, four charge signals S stored in the CCD components Ea are combined together and stored to one of the CCD components Ec, and then the charge signals are shifted out from the CCD shift register 910c. For example, the charge signals S1, S2, S3, and S4, stored in the CCD components Ea1, Ea2, Ea3, and Ea4, are combined and stored to the CCD component Ec1, and the charge signals S5, S6, S7, and S8 stored in the CCD components Ea5, Ea6, Ea7, and Ea8 are combined and stored in the CCD component Ec2. Then, the charge signals S1+S2+S3+S4 and S5+S6+S7+S8, stored in the CCD components Ec1 and Ec2, are shifted out from the CCD shift register 910c to obtain the data image signals at a resolution of 300 dpi.

Figure 10:
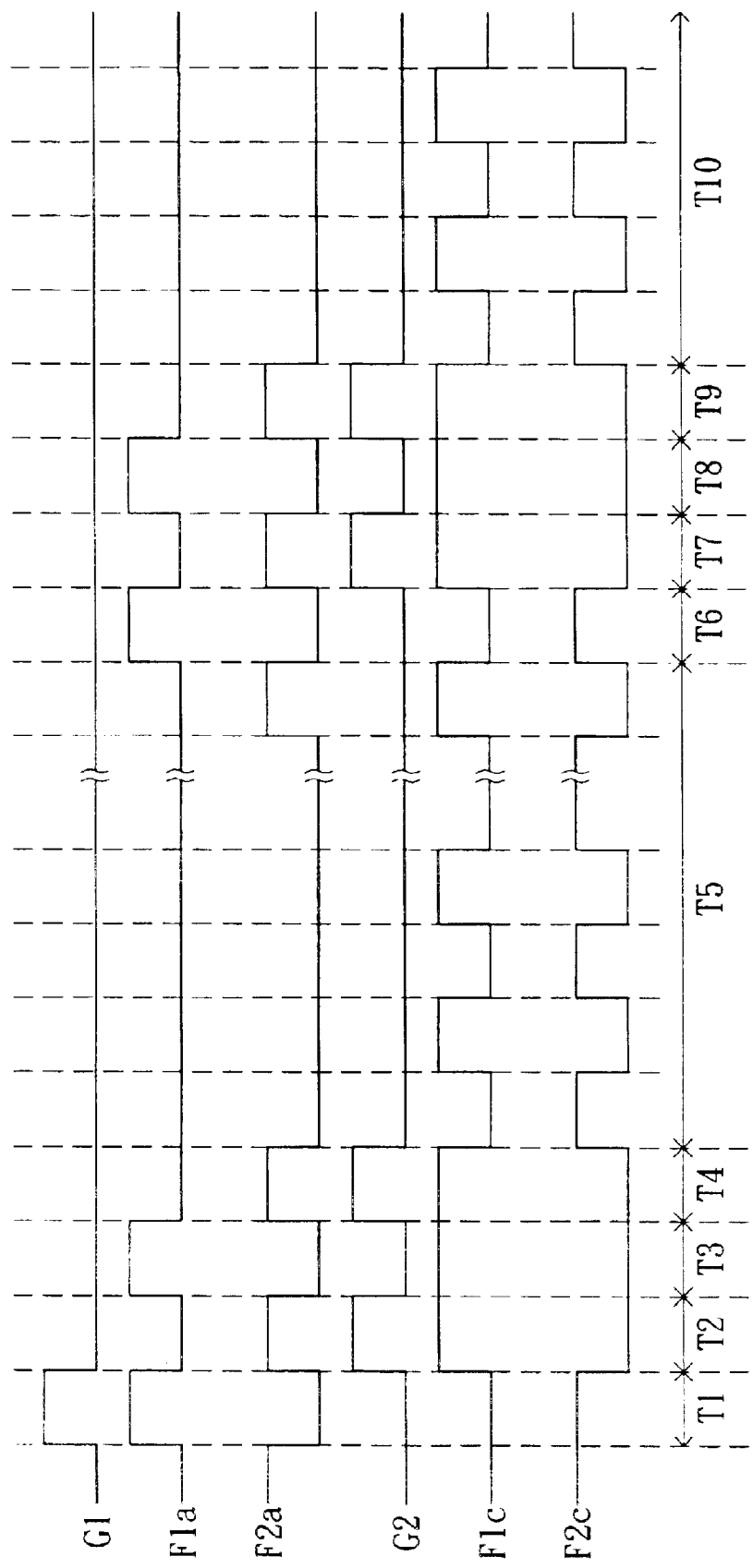
FIG. 10 illustrates a signal waveform for controlling the CCD sensing device in FIG. 9 while scanning at a resolution of 600 dpi.

FIG. 10 illustrates a signal waveform for controlling the CCD sensing device shown in FIG. 9 while scanning at a resolution of 600 dpi. First, the charge signals S are transferred from the photo sensor set 906 to the CCD shift register 910*a* during the time interval T1. Subsequently, control signal G1 is changed to a low voltage level, while control signal G2 is changed to a high voltage level during the time interval T2. Meanwhile, the charge signals S1 and S5 are transferred from the CCD components Ea1 and Ea5 to the CCD components Ec1 and Ec2, respectively. The charge signals S2, S3, S4, S6, S7, and S8 stored in the CCD components Ea2, Ea3, Ea4, Ea6, Ea7, and Ea8 are shifted right to the CCD components Ea1', Ea2', Ea3', Ea5', Ea6', and Ea7', respectively.

Then, control signal G2 is changed to a low voltage level, while phase signals F2*a* and F1*a* are changed to a low voltage level and a high voltage level, respectively, so that the charge signals S still stored in the CCD shift register 910*a* can be shifted right during the time interval T3. Thus, the above-mentioned charge signals S2, S3, S4, S6, S7, and S8, which have been shifted to Ea1', Ea2', Ea3', Ea5', Ea6', and Ea7', can be further shifted out to Ea1, Ea2, Ea3, Ea5, Ea6, and Ea7.

Later, the control signal G2 is changed to a high voltage level, while the phase signal F1*a* is changed to a low voltage level; and a phase signal F1*c* is at a high voltage level, so that the remaining charge signals stored in CCD shift register 910*a* are transferred to the CCD shift register 910*c* during the time interval T4. Thus, the charge signals S2 and S6, which have been shifted to CCD components Ea1 and Ea5, can be transferred to the CCD components Ec1 and Ec2, respectively. At this time, the CCD components Ec1 and Ec2 store the charge signals S1+S2 and S5+S6, respectively.

Eventually the charge signals stored in the CCD shift register 910*c* can be shifted out to the output capacitor C, and the scanned image data signals of 300 dpi are then generated by simply having the control signal G2 changed to a low voltage level, and the phase signals F2*c* and F1*c* alternate between high and low voltage levels during the following time interval T5. There are now only the remaining the charge signals S3, S4, S7, and S8 stored in Ea1', Ea2', Ea5' and Ea6'.

The same signal waveform emerges during the time intervals T6 to T10. The charge signals S3,S4,S7, and S8 are shifted to the CCD components Ea1, Ea2, Ea5, and Ea6 during the time interval T6. The charge signals S3 and S7 are transferred to the CCD components Ec1 and Ec2, and the charge signals S4 and S8 are shifted to the CCD components Ea1' and Ea5', respectively, during the time interval T7. The charge signals S4 and S8 are shifted to the CCD components Ea1 and Ea5 during the time interval T8. Then, the charge signals S4 and S8 are transferred to the CCD components Ec1 and Ec2 during the time interval T9. Presently, the CCD components Ec1 and Ec2 store the charge signals S3+S4 and S7+S8, respectively. During the following interval T10, the charge signals stored in the CCD shift register 910*c* are shifted out; for example, the charge signals S3+S4 and S7+S8 are output to the output capacitor C to generate the second image data signals with a resolution of 300 dpi. The last step is to integrate the first and second image data signals, for example by using software, and then image data signals with a resolution of 600 dpi can be obtained.

Figure 11:
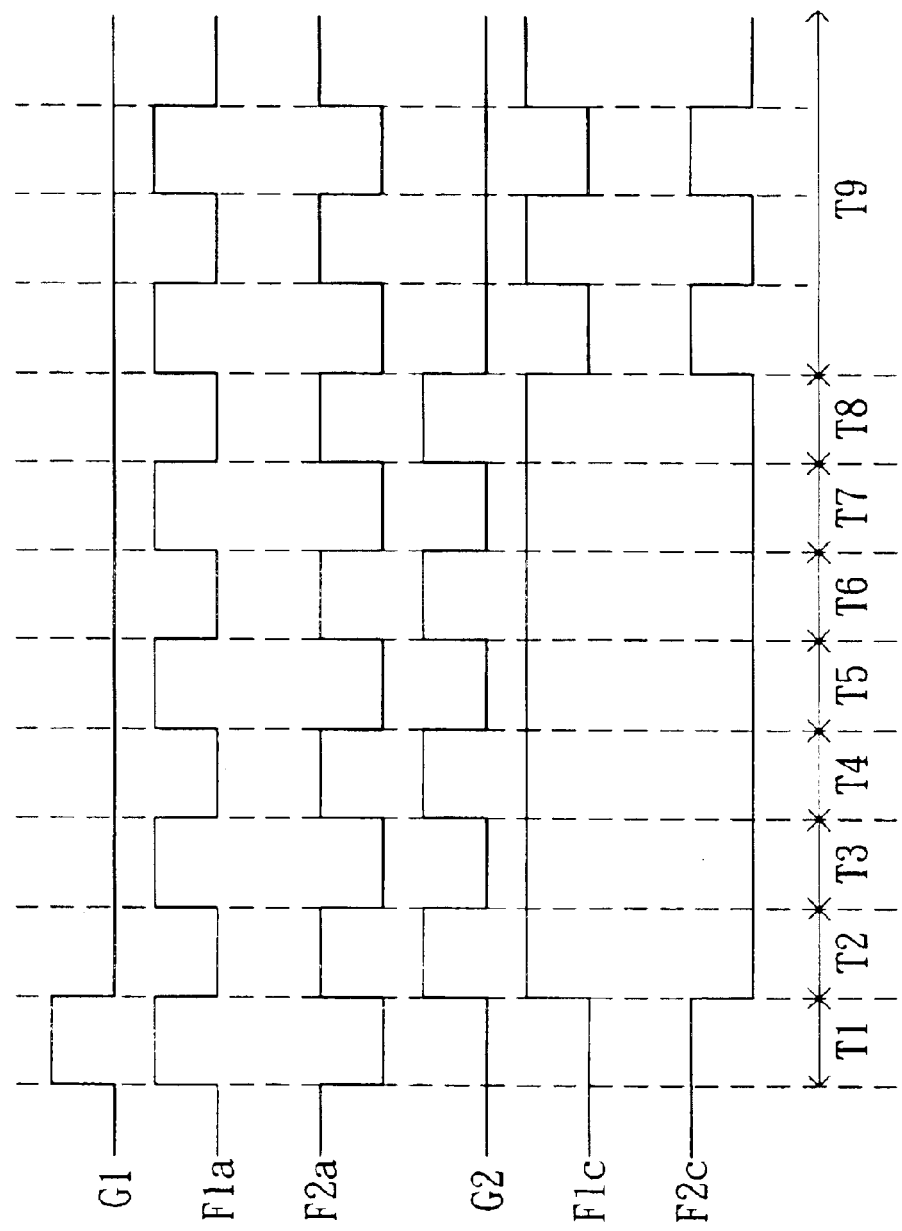
FIG. 11 illustrates a signal waveform for controlling the CCD sensing device in FIG. 9 while scanning at a resolution of 300 dpi.

FIG. 11 illustrates a signal waveform for controlling the CCD sensing device 902 shown in FIG. 9 while scanning at a resolution of 300 dpi. First, the charge signals S are transferred from the photo sensor set 906 to the CCD shift register 910*a* during the time interval T1. Subsequently, the charge signals S1 and S5 are transferred from the CCD components Ea1 and Ea5 to the CCD components Ec1 and Ec2, respectively, during the time interval T2. The charge signals S2, S3, and S4, originally stored in the CCD components Ea2, Ea3, and Ea4, are shifted in order to the right and sequentially stored in the CCD components Ec1 of the CCD shift register 910*c* from time intervals T2 to T8. The charge signals S6, S7, and S8, originally stored in the CCD components Ea6, Ea7, and Ea8, are also shifted in order to the right and sequentially stored in the CCD components Ec2. Meanwhile, the CCD components Ec1 and Ec2 store the charge signals S1+S2+S3+S4 and S5+S6+S7+S8, respectively. During the following time interval T9, the charge signals stored in the CCD shift register 910*c* are shifted out to the output capacitor C, generating the image data signals with a resolution of 300 dpi.

The multi-resolution CCD sensing device, according to the above-mentioned embodiments of the invention, is used for scanning at different resolutions. It can achieve the objects of economy of size, lower costs, and a higher yield rate. It can also increase the scanning speeds at low resolutions without causing problems with vague signals, therefore enhancing the scanned image quality and speeding up the signal transmission.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-resolution charge-coupled device (CCD) sensing device, comprising:

a first CCD shift register with 2M first CCD components, which are $Ea[1]$, $Ea[1]'$, $Ea[2]$, $Ea[2]'$, ..., $Ea[M]$, and $Ea[M]'$, respectively, wherein $Ea[1]$, $Ea[2]$, ..., $Ea[M]$ temporarily store M charge signals $S[1]$, $S[2]$, ..., $S[M]$, respectively;

a second shift gate which is coupled to the first CCD shift register; and a second CCD shift register which is coupled to the second shift gate and has 2N second CCD components, which are $Eb[1]$, $Eb[1]'$, $Eb[2]$, $Eb[2]'$, ..., $Eb[N]$, $Eb[N]'$, respectively, wherein the charge signals stored in the first CCD shift register can be transferred to the second CCD shift register while the second shift gate is turned on;

wherein M is equal to L times N, where L is an integer greater than 1, and the charge signals are directly shifted out from the first CCD shift register while transmitting at a first resolution;

wherein while transmitting at a second resolution, which is 1/k times the first resolution (where k is a factor of L, L/k=j, k>1), firstly, a variable i is set to 0, i is an integer, and the charge signals stored in the first CCD components $Ea[(k*i)+1]$ to $Ea[(k*i)+k]$ are combined, the charge signals stored in the first CCD components $Ea[(k*i+L)+1]$ to $Ea[(k*i+L)+k]$ are combined, ..., and the charge signals stored in the first CCD components $Ea[(k*i+L*(N-1))+1]$ to $Ea[(k*i+L*(N-1))+k]$ are combined, and the N set of combined charge signals are stored in the corresponding second CCD components $Eb[1]$, $Eb[2]$, ..., and $Eb[N]$ respectively, and then the charge signals, which have been combined in the second CCD components Eb[1], Eb[2], ..., Eb[N], are shifted out from the second CCD shift register, so as to achieve a first combining and shifting out procedure; secondly, the value of i is charged from 1 to (j−1) in order, wherein each time the value of i is incremented by 1, another combining and shifting out procedure as mentioned above repeat once each time, until all of the charge signals stored in the first CCD shift register are output.

2. The multi-resolution CCD sensing device according to claim 1, wherein the CCD components Ea[1], Ea[L+1], Ea[L*2+1]. . . , Ea[L*(N−1)+1] of the first CCD shift register and the CCD components Eb[1], Eb[2], Eb[3], . . . , Eb[N] of the second CCD shift register are coupled to the second shift gate correspondingly.

3. The multi-resolution CCD sensing device according to claim 1, further comprising:

a first shift gate, which is coupled to the CCD components Ea[1], Ea[2], . . . , Ea[M] of the first CCD shift register; and a photo sensor set, including M photo sensing components D[1], D[2], . . . , D[M], the photo sensing components D[1], D[2], . . . , D[M] and the CCD components Ea[1], Ea[2], . . . , Ea[M] of the first CCD shift register are coupled to the first CCD shift gate correspondingly, wherein the photo sensing components D[1], D[2], . . . , D[M] are used for receiving a light signal and generating M corresponding charge signals S[1], S[2], . . . , S[M], wherein the M charge signals S[1], S[2], . . . , S[M] stored in the CCD components Ea[1], Ea[2], . . . , Ea[M] mentioned above is come from the M charge signal S[1], S[2], . . . , S[M] generated from the photo sensor set.

\* \* \* \* \*